US008199929B2

(12) United States Patent
Chi et al.

(10) Patent No.: US 8,199,929 B2
(45) Date of Patent: Jun. 12, 2012

(54) ANTI-POP CIRCUIT

(75) Inventors: Cheng-Jan Chi, Taipei (TW); Hung-Yuan Li, Taipei (TW); Sheng-Neng Yu, Taipei (TW); Sheng-Fu Yang, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 1572 days.

(21) Appl. No.: 11/400,317

(22) Filed: Apr. 10, 2006

(65) Prior Publication Data

US 2006/0245602 A1 Nov. 2, 2006

(30) Foreign Application Priority Data

May 2, 2005 (TW) ............................... 94114142 A

(51) Int. Cl.
*H04B 15/00* (2006.01)
*H03F 1/14* (2006.01)

(52) U.S. Cl. ........................................ 381/94.5; 330/51

(58) Field of Classification Search ................. 381/94.5, 381/120; 330/51; 455/212, 218, 219, 220, 455/221, 222, 223
See application file for complete search history.

(56) References Cited

U.S. PATENT DOCUMENTS

| | | | | | |
|---|---|---|---|---|---|
| 5,151,942 | A | * | 9/1992 | Sasaki | 381/94.5 |
| 5,255,094 | A | * | 10/1993 | Yong et al. | 348/632 |
| 5,734,729 | A | * | 3/1998 | Tran | 381/94.5 |
| 5,825,251 | A | * | 10/1998 | Nakagawa | 330/297 |
| 6,847,269 | B2 | * | 1/2005 | Watanabe et al. | 333/126 |

* cited by examiner

*Primary Examiner* — Vivian Chin
*Assistant Examiner* — Kile Blair
(74) *Attorney, Agent, or Firm* — Muncy, Geissler, Olds & Lowe, PLLC

(57) ABSTRACT

An anti-pop circuit is coupled with a sound outputting device to prevent a "pop" sound form being mixed into a sound signal. The anti-pop circuit includes a control signal generator and a fist diode. The control signal generator generates a control signal with a high level state and a low level state. The first diode couples with the sound outputting device. The sound signal is transferred to the first diode when said first diode is in a forward bias state, and the sound signal is outputted from an output end of the sound outputting device when the first diode is in a reverse bias state.

2 Claims, 2 Drawing Sheets

ANTI-POP CIRCUIT

RELATED APPLICATIONS

The present application is based on, and claims priority from, Taiwan Application Serial Number 94114142, filed May 2, 2005, the disclosure of which is hereby incorporated by reference herein in its entirety.

FIELD OF THE INVENTION

The present invention is about an anti-pop circuit, and more particularly, is about an anti-pop circuit including a diode.

BACKGROUND OF THE INVENTION

FIG. 1 illustrates a typical audio output circuit 100. An electrostatic protection circuit 102 is used to shunt harmful external static electricity away from the audio output circuit 100. A sound signal from an audio IC or a speaker is outputted through a low-pass filter 104 and the electrostatic protection circuit 102.

However, a "pop" sound is always intermixed with the outputted sound signal at the moment the power (Vcc) is turned on or off due to the voltage spiking. Typically, an anti-pop circuit 106 is installed in the audio output circuit 100 to eliminate the "pop" sound F*igure* 1 illustrates a typical anti-pop circuit 106 including two NPN type bipolar junction transistors (BJTs) 108 and 110. Before the power (Vcc) is turned on, a control signal triggers the anti-pop circuit 106 first to activate the BJT 110 for preventing the "pop" sound due to a voltage spike from mixing into the outputted voice signal. Specifically, a control signal with a low voltage level is outputted first to turn off the BJT 108 so that a high voltage level is generated to turn on the BJT 110.

Typically, a special time period to keep BJT 110 turned on is set, such as 10 ms, after which the power is considered stable and not prone to cause "pop" sounds from spiking. After the set time period is reached, the control signal is transferred from a low voltage level to a high voltage level to turn on the BJT 108 so as to generate a low voltage level to turn off the BJT 110. At this time, the anti-pop circuit 106 is turned off.

Because the control signal has an inverse polarity to that of the power (Vcc), a BJT 108 is required in a typical anti-pop circuit to act as an inverter, which requires an additional cost. Moreover, the control signal is required to cooperate with turning on and off the power (Vcc) to trigger the anti-pop circuit. Therefore, controlling the time sequence of the control signal and the power (Vcc) is very important.

Accordingly, an anti-pop circuit with simple structure and simple control is necessary.

SUMMARY OF THE INVENTION

Therefore, the main purpose of the present invention is to provide a simple structure anti-pop circuit.

Accordingly, the present invention provides an anti-pop circuit composed of diodes. A control signal is used to change the bias of the diodes to shunt the "pop" sound at the moment of turning on or off the power (Vcc).

In one embodiment, the anti-pop circuit of the present invention includes a first diode and a charge/discharge circuit. The charge/discharge circuit is composed of at least one resistor and at least one capacitor and is connected to the main power (Vcc). The resistor and the capacitor have a common contact. This common contact is connected to the first diode. The working time of the anti-pop circuit is determined by charging the capacitor.

In another embodiment, the anti-pop circuit of the present invention includes a first diode, a discharging route and a charge/discharge circuit. The charge/discharge circuit is composed of at least one resistor and at least one capacitor and is connected to a control power (Vcc). The resistor and the capacitor have a common contact. This common contact is connected to the first diode. The working time of the anti-pop circuit is determined by charging the capacitor. This discharging route can accelerate changing the diode bias.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

Embodiments of the anti-pop circuit are described in the following paragraphs to explain the present invention. It is noticed that the electrostatic protection circuit 102 illustrated in the figures can be removed in other embodiments. However, the anti-pop circuit of the present invention can be applied in any audio output apparatus no matter whether an electrostatic protection circuit is included or not.

Figure 1:
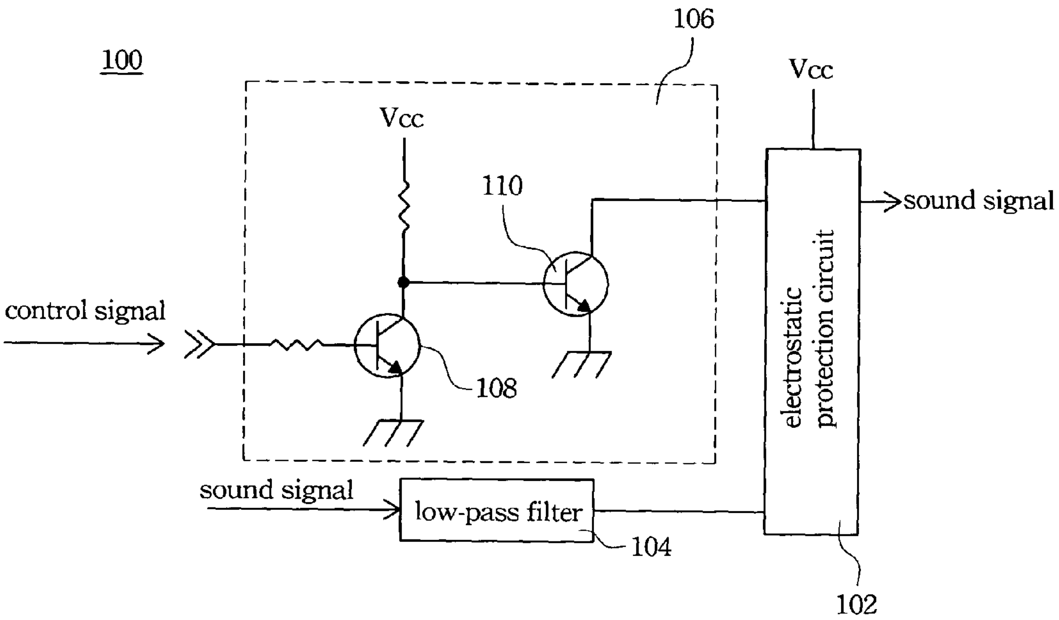
Fig. 1 (PRIOR ART)
FIG. 1 illustrates a typical sound output apparatus with an anti-pop circuit.
Figure 2:
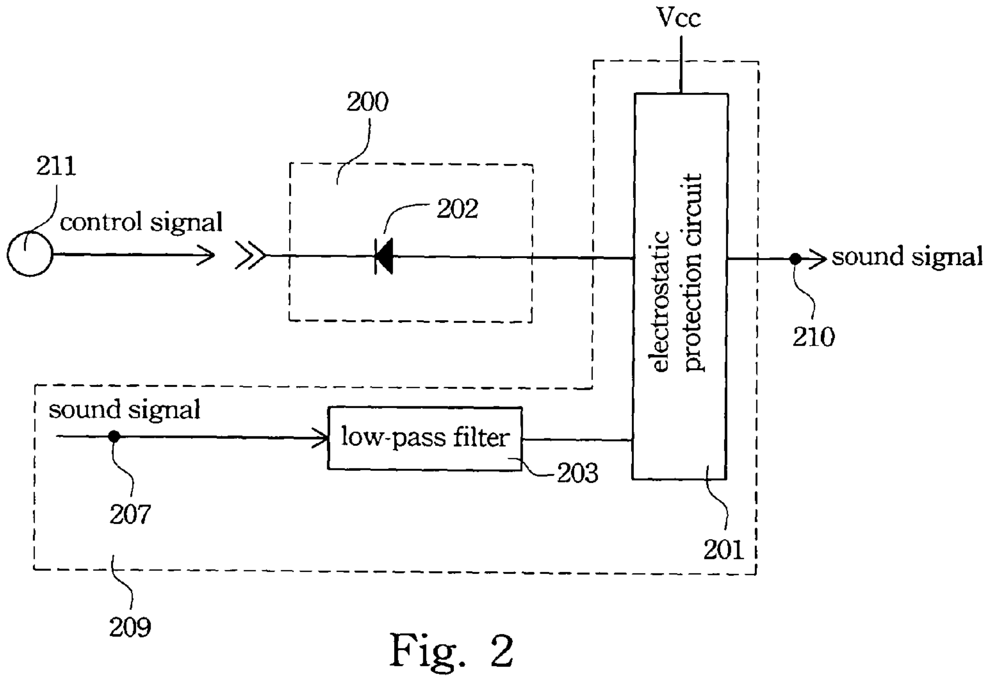
FIG. 2 illustrates an anti-pop circuit according to the first embodiment of the present invention.

FIG. 2 is an anti-pop circuit according to the first embodiment of the present invention. The sound output apparatus 209 includes an input end 207, a low-pass filter 203, an electrostatic protection circuit 201 and an output end 210. The anti-pop circuit 200 includes a first diode 202 that is triggered by an independent control signal generated by a control signal generator 211.

When the power is turned on or turned off, the first diode 202 is maintained in a forward bias state to avoid the popping phenomenon. According to this embodiment, the control signal is set to a low voltage level to trigger the anti-pop circuit 200. Then, the sound signal generated 209 at the moment of turning on or turning off the power drain through the low-pass filter 203, the electrostatic protection circuit 201 and the first diode 202. After a time frame, such as 8 ms, the first diode 202 is changed to reverse bias. According to this embodiment, the control signal is set to a high voltage level to close the anti-pop circuit 200. At this time, the sound signal is outputted through the low-pass filter 203 and the electrostatic protection circuit 201. Therefore, the high voltage level control signal generated by the control signal generator 211 is delayed for certain time frame behind the moment of turning on the power. In an embodiment, the control signal is generated by a general purpose input/output pin. When the power is turned off, the control signal changes the bias of the first diode 202 from reverse bias to forward bias so as to shunt the popping sound generated at the moment of turning off the power from the first diode 202.

According to the first embodiment of the present invention, only one first diode 202 is required to form the anti-pop circuit, which simplifies the structure of the anti-pop circuit and reduces the cost to produce the circuit. Moreover, the phase of the control signal is the same as the phase of the power (Vcc). Therefore, when operating, after the time frame is passed, the control signal is switched to change the bias of the first diode from forward to reverse. The time sequence control is thus very simple.

Figure 3:
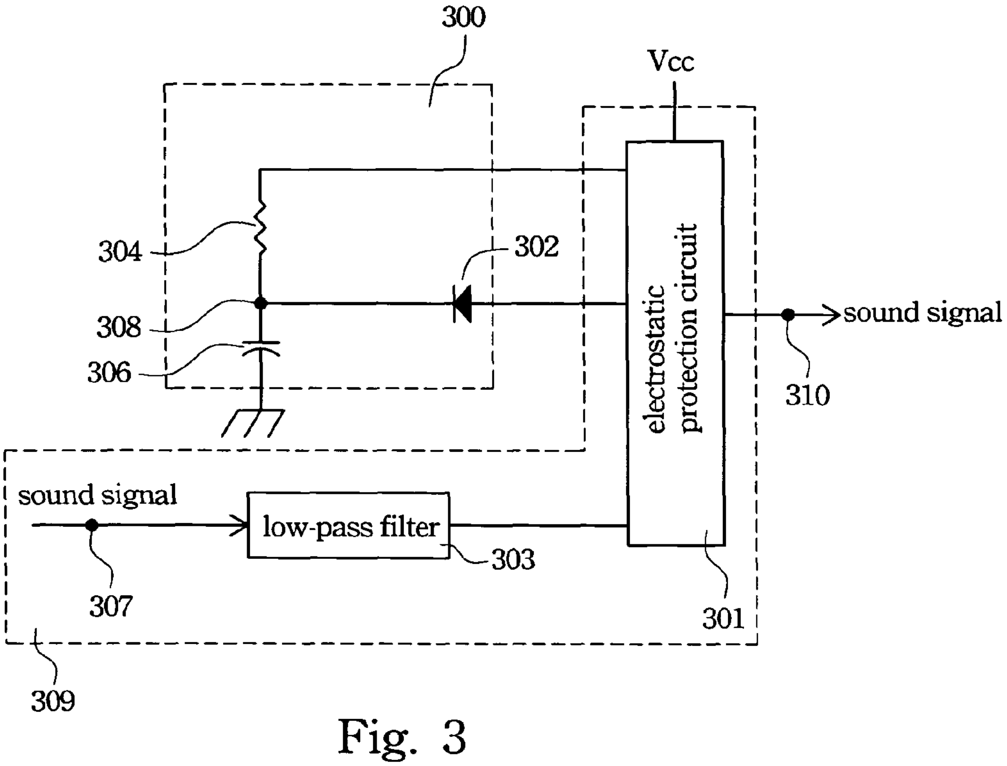
FIG. 3 illustrates an anti-pop circuit according to the second embodiment of the present invention.

FIG. 3 illustrates an anti-pop circuit according to the second embodiment of the present invention. In this embodiment, a charge/discharge circuit composed of one resistor and one capacitor is used to set a time frame. After the time frame elapsed, the bias of the first diode is switched from forward to reverse. The time frame can be adjusted by changing the values of the resistor and the capacitor.

According to the second embodiment, the sound output apparatus 309 includes an input end 307, a low-pass filter 303, an electrostatic protection circuit 301 and an output end 310. The anti-pop circuit 300 includes a first diode 302, a resistor 304 and a capacitor 306. The first diode 302 is connected to a common contact 308 between the resistor 304 and the capacitor 306. The resistor 304 and the capacitor 306 form a charge/discharge route.

When the power is turned on, the first diode 302 is maintained in a forward bias. At this time, the anti-pop circuit 300 is turned on to shunt the "pop" sound through the diode 302. And, the power (Vcc) charges the capacitor 306 through the resistor 304 until the voltage across the capacitor 306, the voltage of the common contact 308, reaches the voltage needed to change the bias of the first diode 302. The bias of the first diode 302 is then changed from forward to reverse to turn off the anti-pop circuit 300. At this time, the sound signal is outputted through the low-pass filter 303 and the electrostatic protection circuit 301.

On the other hand, when the power is turned off, the capacitor 306 is discharged through the resistor 304 to reduce the voltage of the common contact 308 so as to change the bias of the first diode 302 from reverse to forward. When the first diode 302 is in forward bias, the anti-pop circuit 300 is turned on again to shunt the popping sound generated when turning off the power through the first diode 302.

According to the second embodiment of the present invention, the charge/discharge route composed of the resistor 304 and the capacitor 306 is connected to the power (Vcc). The time to charge the capacitor 306 to the voltage necessary to change the first diode 302 is defined as the working time of the anti-pop circuit 300. Therefore, according to this embodiment, the working time of the anti-pop circuit 300 can be adjusted by modulating the values of the resistor 304 and the capacitor 306.

In this embodiment, the anti-pop circuit 300 is triggered to shunt the "pop" sound when the power is turned on, and the anti-pop circuit 300 is turned off when the capacitor 306 is charged to the voltage needed to change the bias of the first diode 302. Therefore, it is not necessary to use an additional control signal to control the turning on and off of the anti-pop circuit in the second embodiment.

Figure 4:
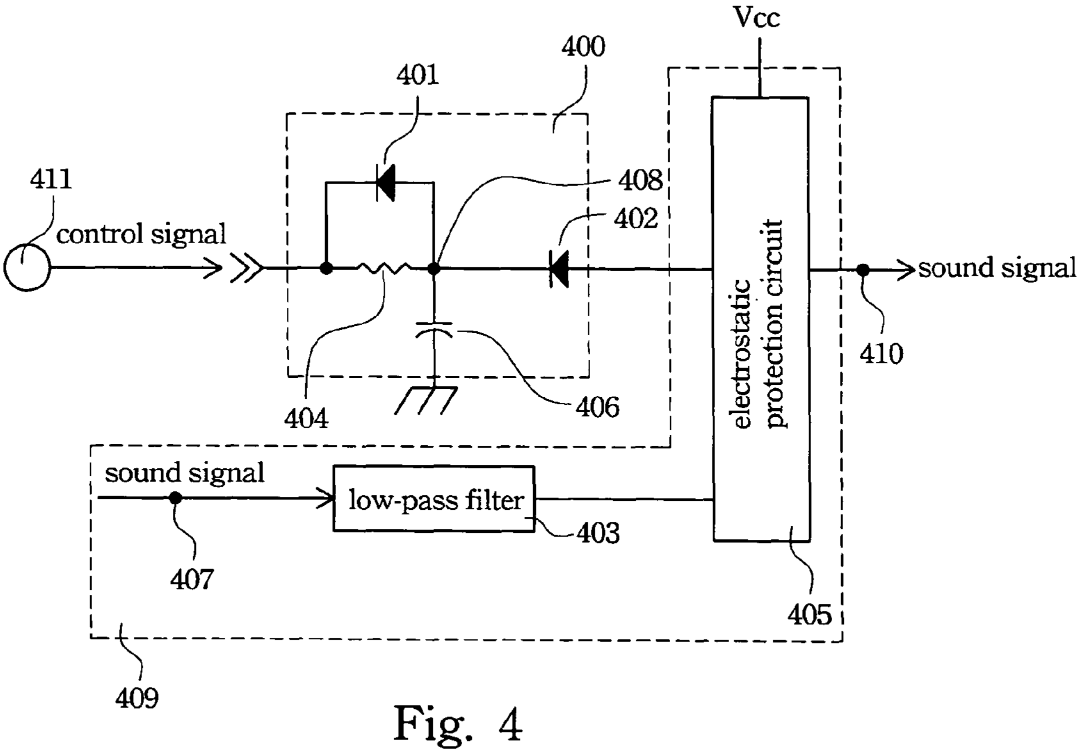
FIG. 4 illustrates an anti-pop circuit according to the third embodiment of the present invention.

FIG. 4 illustrates an anti-pop circuit according to the third embodiment of the present invention. According to the third embodiment, the sound output apparatus 409 includes an input end 407, a low-pass filter 403, an electrostatic protection circuit 405 and an output end 410. The anti-pop circuit 400 includes a first diode 402, a second diode 401, a resistor 404 and a capacitor 406. The first diode 402 is connected to the common contact 408 between the resistor 404 and the capacitor 406. The resistor 404 and the capacitor 406 form a charge/discharge route. The second diode 401 is used as an additional discharging route. A control signal generator 411 is connected to the resistor 404.

When the power is turned on, the first diode 402 is maintained in forward bias. At this time, the anti-pop circuit 400 is turned on to shunt the "pop" sound through the diode 402. Then, after a predetermined time period, the bias of the first diode 402 is changed from forward to reverse bias to turn off the anti-pop circuit 400. At this time, the sound signal is outputted through the low-pass filter 403 and the electrostatic protection circuit 405. According to this embodiment, the predetermined time frame is the time taken for the capacitor 406 to be charged to the voltage needed to change the bias of the first diode 402.

In this embodiment, the control signal generator 411 is triggered when the power (Vcc) is turned on. The control signal from the control signal generator 411 may charge the capacitor 406 through the resistor 404. While the capacitor 406 is charged, the first diode 402 is maintained in a forward bias to shunt the "pop" sound. In an embodiment, the control signal is generated by a general purpose input/output pin. When the voltage across the capacitor 406, the voltage of the common contact 408, reaches the voltage of changing the bias of the first diode 402, the bias of the first diode 402 is changed from forward to reverse bias to turn off the anti-pop circuit 400. At this time, the sound signal is outputted through the low-pass filter 403 and the electrostatic protection circuit 405.

On the other hand, when the power is turned off, the capacitor 406 is discharged through the resistor 404 and the second diode 401 to reduce the voltage of the common contact 408 so as to change the bias of the first diode 402 from reverse to forward bias. When the first diode 402 is in forward bias, the anti-pop circuit 400 is turned on again to shunt the popping sound through the first diode 402.

According to the third embodiment of the present invention, the charge/discharge route composed of the resistor 404 and the capacitor 406 may determine the changing time of the first diode 402. Therefore, the changing time of the first diode 402 can be adjusted by modulating the values of the resistor 404 and the capacitor 406. On the other hand, when the power (Vcc) is turned off, an additional discharging route, the second diode 401, is provided in the present invention to enhance the capacitor 406 discharging. Therefore, the anti-pop circuit 400 can be turned on quickly to shunt the "pop" sound when the power (Vcc) is turned off.

Accordingly, the anti-pop circuit of the present invention includes a first diode. The working time of the anti-pop circuit is determined by the changing time of the diode. Moreover, a charge/discharge route composed of a resistor and a capacitor is used to trigger and turn off the anti-pop circuit. The working time of the anti-pop circuit can be adjusted by modulating the values of the resistor and the capacitor, which makes an additional control signal to control the turning on and off of the anti-pop circuit unnecessary in some embodiments. The circuit also can be simplified compared to the prior art.

As is understood by a person skilled in the art, the foregoing descriptions of the preferred embodiments of the present invention are an illustration of the present invention rather than a limitation thereof. Various modifications and similar arrangements are included within the spirit and scope of the appended claims. The scope of the claims should be accorded to the broadest interpretation so as to encompass all such modifications and similar structures. While preferred embodiments of the invention have been illustrated and described, it will be appreciated that various changes can be made therein without departing from the spirit and scope of the invention.

What is claimed is:

1. An anti-pop circuit, wherein said circuit is coupled with a sound outputting device to prevent a "pop" sound from being mixed into a sound signal, a power is coupled with said device, and said sound signal is inputted from an input end of said device, comprising:

a control signal generator for generating a control signal with a high level state and a low level state;

a first diode coupling with said device, said sound signal is transferred to said first diode when said first diode is in a forward bias state, and said sound signal is outputted from an output end of said device when said first diode is in a reverse bias state, wherein said first diode is in a forward bias state when said control signal is in a low level state, and said first diode is in a reverse bias state when said control signal is in a high level state, a charge/discharge circuit including a capacitor and a resistor, wherein said capacitor and said resistor are connected in a common contact and said first diode is connected to said common contact; and a second diode connected to said common contact, wherein when said control signal is in a high level state, said control signal charges said capacitor through said resistor and when said control signal is changed to a low level state, said capacitor is discharged through said second diode and said resistor, wherein said control signal is outputted from a general purpose input/output pin.

2. The anti-pop circuit of claim 1, wherein after said power is turned on for a predetermined time frame, said control signal with a high level state is generated.

* * * * *